(12) United States Patent
Murayama

(10) Patent No.: US 6,303,998 B1
(45) Date of Patent: *Oct. 16, 2001

(54) SEMICONDUCTOR DEVICE HAVING A CHIP MOUNTED ON A RECTANGULAR SUBSTRATE

(75) Inventor: Kei Murayama, Nagano (JP)

(73) Assignee: Shinko Electric Industries Co., Ltd., Nagano (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/376,606

(22) Filed: Aug. 18, 1999

(30) Foreign Application Priority Data

Dec. 24, 1997 (JP) .................................................. 9-354556

(51) Int. Cl.[7] .......................... H01L 23/12; H01L 23/50; H01L 23/48; H01L 29/44; H05K 1/18
(52) U.S. Cl. .......................... 257/778; 257/797; 257/738; 257/737; 257/686; 257/485; 257/723; 257/777; 257/787; 257/668; 257/702; 257/469; 257/788
(58) Field of Search .................................. 257/778, 777, 257/734, 737, 738, 779, 789, 686, 685, 723, 797, 787, 468, 402, 669, 788

(56) References Cited

U.S. PATENT DOCUMENTS

| | | | |
|---|---|---|---|
| 3,869,787 | * 3/1975 | Umhaugh . | |
| 5,410,185 | 4/1995 | Kurafuchi et al. | 257/692 |
| 5,677,575 | * 10/1997 | Maeta et al. | 257/778 |
| 5,682,297 | * 10/1997 | Silva | 362/777 |
| 5,834,848 | * 11/1998 | Iwasaki | 257/778 |
| 5,892,289 | * 4/1999 | Tokuno | 257/783 |
| 5,936,304 | * 8/1999 | Li et al. | 257/701 |
| 5,962,925 | * 10/1999 | Eifuku et al. | 257/778 |
| 5,969,426 | * 10/1999 | Baba et al. | 257/778 |
| 5,973,930 | * 10/1999 | Ikeda et al. | 361/768 |
| 6,094,155 | * 8/2000 | Harden et al. | 438/460 |
| 6,139,978 | * 10/2000 | Arai et al. | 428/620 |
| 6,174,751 | * 1/2001 | Oka | 438/113 |
| 6,177,724 | * 1/2001 | Sawai | 252/737 |
| 6,225,433 | * 5/2001 | Isshiki et al. | 257/788 |

FOREIGN PATENT DOCUMENTS

| | | |
|---|---|---|
| 2-10887 A | 1/1990 | (JP) . |
| 2-16791 A | 1/1990 | (JP) . |
| 3-171645 | 7/1991 | (JP) . |
| 4-28243 A | 1/1992 | (JP) . |
| 4-292803 A | 10/1992 | (JP) . |
| 5-326582 | * 12/1993 | (JP) . |
| 6-21257 A | 1/1994 | (JP) . |
| 8-236578 A | 9/1996 | (JP) . |
| WO 98/08326 | 9/1989 | (WO) . |

OTHER PUBLICATIONS

European Search Report.

* cited by examiner

*Primary Examiner*—Alexander O. Williams
(74) *Attorney, Agent, or Firm*—Pennie & Edmonds LLP

(57) ABSTRACT

A semiconductor device 14 capable of reducing the warpage in a substrate is provided. A semiconductor chip 12 is mounted on a substrate 10 made of an electro-insulating material by flip-chip bonding, so that connector terminals formed on the substrate 10 are connected to electrodes of the semiconductor chip 12 and a gap between the substrate 10 and the semiconductor chip 12 is filled with an underfiller 18. According to the present invention, in the semiconductor device 14, none of sides of the substrate 10 is parallel to any one of sides of the semiconductor chip 12, and none of diagonal lines S of the substrate 10 coincides with any one of diagonal lines T of the semiconductor chip 12.

9 Claims, 8 Drawing Sheets

Prior Art

Prior Art

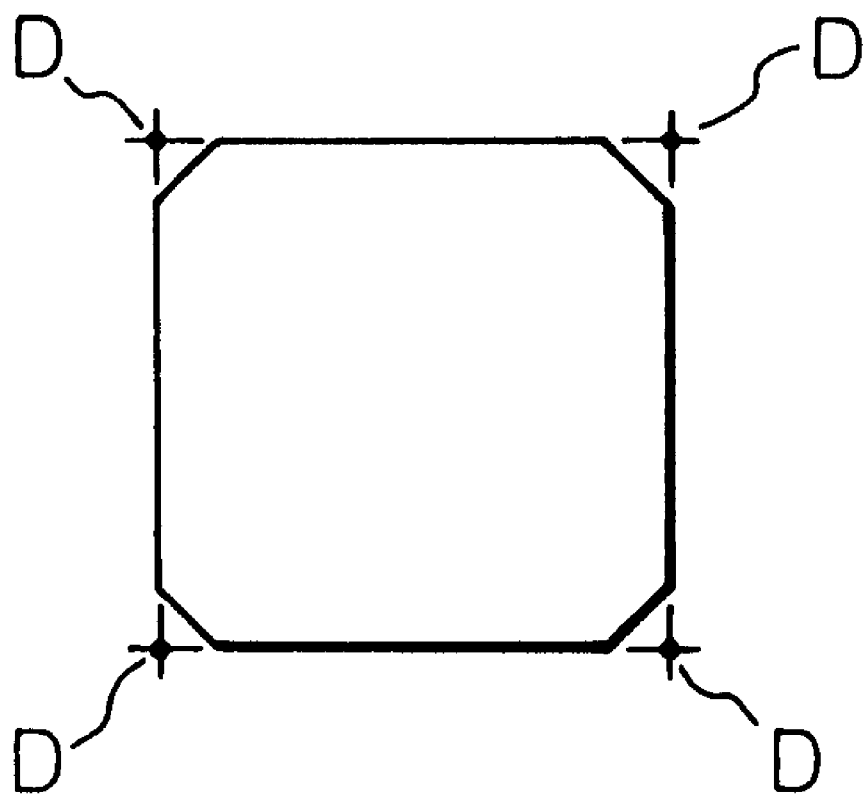

Fig.9(a)

COMPARISON BETWEEN CHIP MOUNTING POSITIONS

| INCLINATION ANGLE (°) | SAMPLE NO. | FLATNESS | | | DIRECTION | |
|---|---|---|---|---|---|---|
| | | INITIAL STATE | FINAL STATE | DELTA | INITIAL STATE | FINAL STATE |
| 0 | 5 | −61.1 | 194.6 | 255.7 | )( | (( |
| | 9 | 100.7 | 267.0 | 166.3 | (( | (( |
| | 1 | 119.1 | 276.1 | 157.0 | (( | (( |
| | 7 | 151.6 | 299.4 | 147.8 | (( | (( |
| | 10 | 199.0 | 365.8 | 166.8 | (( | (( |
| 45 | 3 | −135.9 | 115.0 | 250.9 | )( | )( |
| | 2 | 86.6 | 230.8 | 144.2 | (( | (( |
| | 8 | 116.2 | 260.2 | 144.0 | (( | (( |
| | 6 | 159.8 | 234.8 | 75.0 | (( | (( |
| | 4 | 220.0 | 347.7 | 127.7 | (( | (( |

{ COMPARATIVE EXAMPLES (samples 5, 9, 1, 7, 10)

{ EXAMPLES (samples 3, 2, 8, 6, 4)

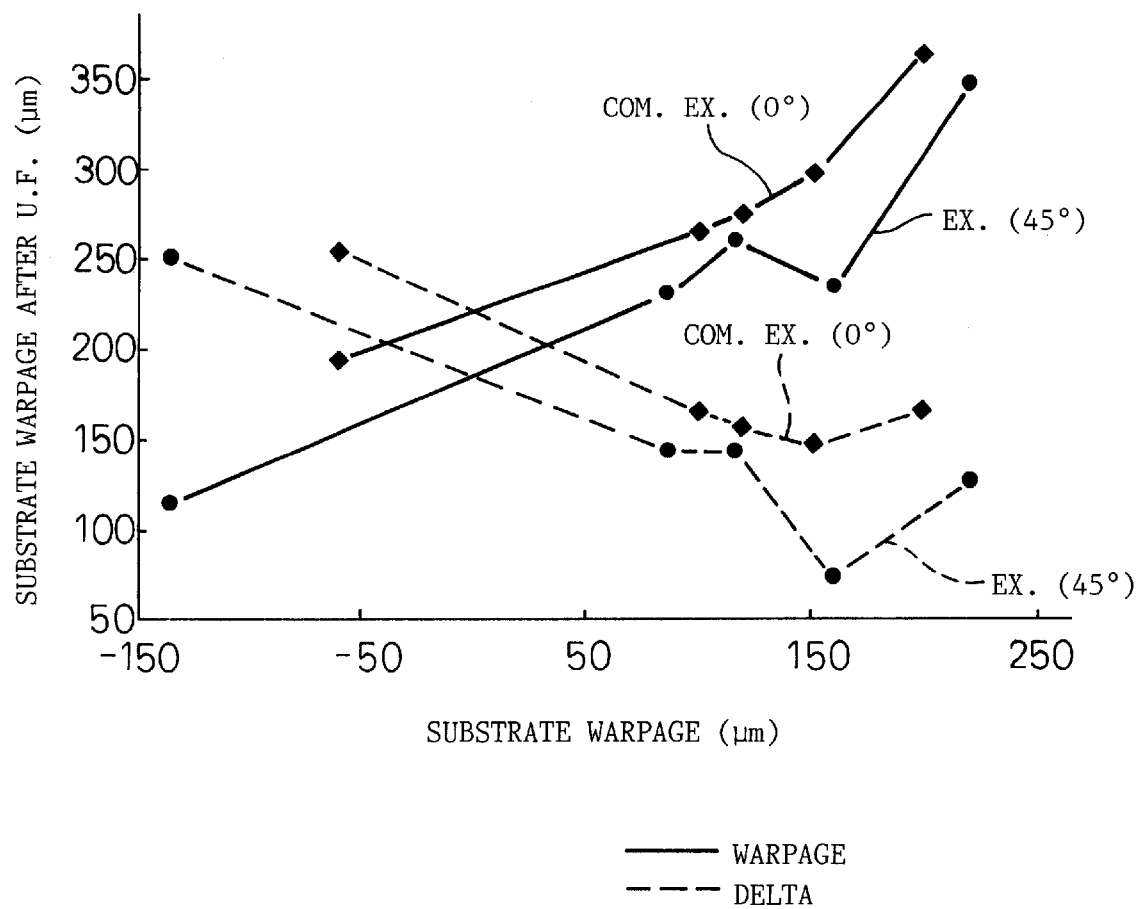

SEMICONDUCTOR DEVICE HAVING A CHIP MOUNTED ON A RECTANGULAR SUBSTRATE

TECHNICAL FIELD

The present invention relates to a semiconductor device wherein a semiconductor chip is mounted onto a substrate by flip-chip bonding and is fixed thereto via an adhesive means.

BACKGROUND ART

A general structure of a semiconductor device 14 wherein a semiconductor chip 12 is mounted on a substrate 10 made of an electro-insulating material will be described with reference to FIG. 1 and FIG. 2(c) which is a sectional view taken along line A—A in FIG. 1.

In this regard, flip-chip bonding is a method for bonding the semiconductor chip 12 onto the substrate 10 while a surface of the former carrying active elements thereon is opposed to the substrate 10. In general, solder bumps 16 are formed as electrodes on the semiconductor chip 12 which is reversed upside down and positioned in place on the substrate 10, after which the solder bumps 16 are molten all together to connect the electrodes with connector terminals (not shown) formed on the substrate 10 and secure the semiconductor chip 12 on the substrate 10. Since the solder bumps are arranged not only on the periphery of the semiconductor chip 12 but also at any positions thereon, it is possible to easily obtain as many input/output terminals (I/O) as needed.

Also, since the semiconductor chip 12 is directly mounted on the substrate 10 via solder, there may be cases wherein an underfiller 18 (such as epoxy type resin) is filled in a gap between the substrate 10 and the surface of the semiconductor chip 12 carrying the active elements thereon to reinforce the bonding for the purpose of improving the reliability (strength) of the connecting portion.

When the flip-chip bonding is carried out, an anisotropic electro-conductive film or anisotropic electro-conductive adhesive having the same adhesive property as the underfiller may be used instead of the latter for bonding the semiconductor chip 12 to the substrate 10. Specifically, a semiconductor chip provided with Au stud bumps prepared by the Au wire-bonding and the substrate coated with the anisotropic electro-conductive adhesive or clad with the anisotropic electro-conductive film is prepared. The semiconductor chip is placed on the substrate via the anisotropic electro-conductive adhesive or the anisotropic electro-conductive film, and the assembly is heated under pressure to connect the semiconductor chip with the substrate. In this regard, the anisotropic electro-conductive adhesive or film contains nickel particles having a size of 3 $\mu$m order in epoxy type resin and is cured by heat in the same manner as in the underfiller.

The above-mentioned prior art semiconductor device 14, however, has the following problems.

The substrate 10 or the semiconductor chip 12 is preferably of a square shape. This is because when a so-called constant-size substrate of a rectangular shape (including a square shape) is cut into individual square substrates 10, or when a sliced silicon wafer of a predetermined diameter is cut into individual square semiconductor chips 12, as many substrates 10 or semiconductor chips 12 as possible are obtainable with least waste, and also the square shape facilitates the patterning efficiency of circuit patterns formed thereon.

The semiconductor chip 12 is mounted onto the substrate 10 so that each of sides of the semiconductor chip 12 is parallel to the corresponding side of the substrate 10. In addition, generally, the semiconductor chip 12 is mounted onto the substrate 10 so that a center of the former coincides with that of the latter. See FIG. 1.

When the semiconductor device 14 is mounted onto an originally flat circuit board (not shown), the semiconductor device 14 itself is preferably of a flat shape to enhance the reliable connection between the circuit board and the substrate 10.

As described before, the connecting portion between the substrate 10 and the semiconductor chip 12 is reinforced, for the purpose of improving the durability or reliability thereof, by the underfiller 18 or the anisotropic electro-conductive adhesive or film which is formed of thermosetting resin and cured through a curing process. Actually, the substrate 10 often warps after the curing process.

This warpage phenomenon of the substrate 10 will be explained with reference to FIGS. 2(a) to 2(c) illustrating states prior to, during and after the curing process, respectively. While the explanation is made on a case wherein the underfiller is used as adhesive interposed between the semiconductor chip 12 and the substrate 10, the same is true to other cases wherein the anisotropic electro-conductive adhesive or film is used instead thereof.

First, in a state shown in FIG. 2(a) wherein the semiconductor chip 12 is merely placed on the substrate 10 prior to the curing process, no substantial warpage occurs both in the substrate 10 and the semiconductor chip 12. That is, an amount of warpage is approximately equal to that in the substrate 10 when it stands alone.

Next, during the curing process wherein the underfiller 18 filled in the gap between the substrate 10 and the semiconductor chip 12 is cured, the substrate 10 thermally extends at a high temperature. However, since the underfiller 18 is completely cured after the substrate 10 has fully expanded, no substantial warpage occurs also in both thereof even in this curing process. See FIG. 2(b).

Finally, in a passage wherein a temperature of the assembly is lowering to a normal temperature, the fully extended substrate 10 gradually contracts as the temperature lowers. Since an amount of contraction of a region B of the substrate 10 in which the semiconductor chip 12 is placed (bonded) (in other words, a region of the substrate 10 in contact with the underfiller 18) is smaller than an amount of contraction of the remaining region of the substrate 10 because the thermal expansion coefficient of the semiconductor chip 12 is smaller than that of the substrate 10. Accordingly, when viewed from a lateral side, a surface of the substrate 10 (a back surface) opposite to a surface thereof including the region B carrying the semiconductor chip 12 therein (a front surface) more contracts than the front surface, whereby the substrate 10 warps so that the back surface thereof is concave as shown in FIG. 2(c).

This warpage of the substrate 10; i.e., the warpage of the semiconductor device 14; has the following relationship with the region B carrying the semiconductor chip 12.

First, the warpage of the substrate 10 is a phenomenon caused by a fact wherein the region B of the substrate 10 in contact with the underfiller 18 could not fully contract to an extent corresponding to the original thermal expansion coefficient thereof, and therefore, the warpage occurs with the region B as a center; specifically, it occurs in the radial direction all over the substrate 10 from the central point of the region B. Assuming the warpage of the substrate 10 along an imaginary straight line L passing by the central point of the region B, there is a relationship in that the longer a segment of the straight line L in the region B, the more the warpage.

Second, assuming again that the warpage of the substrate 10 is along the imaginary line L, since the substrate 10 warps to be a generally U-shape as a whole with the region B as a center as mentioned above, the maximum displacement in the substrate 10 due to the warpage occurs at the intersection of the imaginary straight line L and a contour of the substrate 10 farthest from the region B. In the square-shaped substrate 10, the above-mentioned intersection farthest from the region B is resulted when the imaginary straight line L coincides with a diagonal line of the substrate 10; in other words, such an intersection exists at the respective corner of the substrate 10. That is, the maximum warpage generates between a pair of corners of the substrate 10 located opposite to each other along a diagonal line.

In the prior art semiconductor device 14, both of the substrate 10 and the semiconductor chip 12 are of a square shape, and the semiconductor chip 12 is mounted to the substrate 10 with the respective sides of the substrate 10 being parallel to those of the semiconductor chip 12 and with the center of the substrate coinciding with that of the semiconductor chip 12. Since the diagonal line of the substrate 10 coincides with that of the semiconductor chip 12, a length of the region B on the diagonal line, along which the warpage of the substrate 10 is maximum, is longest. Thus, it is likely that the generation of large warpage occurs at four corners of the substrate 10.

DISCLOSURE OF THE INVENTION

The present invention has been made to solve the above-mentioned problems in the prior art, and an object of the present invention is to provide a semiconductor device capable of reducing the warpage of a substrate.

To achieve such an object, according to the present invention, a semiconductor device, comprising a substrate made of an electro-insulating material and having connector terminals on the surface thereof, a semiconductor chip to be mounted to the substrate and having electrodes to be flip-chip bonded with the connector terminals, and adhesive means filled in a gap between the substrate and the semiconductor chip is provided, characterized in that none of sides of the substrate as seen in a plan view is parallel to any one of sides of the semiconductor chip as seen in a plan view, and none of diagonal lines of the substrate as seen in a plan view coincides with any one of diagonal lines of the semiconductor chip as seen in a plan view.

According to this semiconductor device, a length of a region of the substrate in contact with the adhesive means measured along the diagonal line on which the maximum warpage would occur in the substrate is apparently smaller in comparison with a prior art semiconductor device wherein the diagonal lines of the substrate and the semiconductor chip just coincide with each other. Thereby, it is possible to reduce the warpage at the opposite ends of the diagonal line of the substrate; i.e., at the corners thereof. More concretely, while most of the semiconductor chip and the substrate are of a square shape or a rectangular shape, even in such a case, it is possible to reduce the warpage of the substrate at the corner thereof by such an arrangement that none of the respective sides of the substrate is parallel to any one of the sides of the semiconductor chip, and none of the respective diagonal lines of the substrate coincides with any one of the diagonal lines of the semiconductor chip.

Also, if the semiconductor chip is mounted onto the substrate so that either one of sides of the semiconductor chip is parallel to either one of diagonal lines of the substrate, a length of a region of the substrate carrying the semiconductor chip measured along a diagonal line of the substrate becomes a minimum, whereby the amount of warpage is least.

As the adhesive means, either of underfiller, anisotropic electro-conductive adhesive or anisotropic electro-conductive film having an adhesivity, each comprised of epoxy type resin, may be used. It is possible to obtain an equivalent effect for reducing the warpage by using any of the adhesive means described above.

BRIEF DESCRIPTION OF THE DRAWINGS

FIG. 2($a$) showing a state wherein a semiconductor chip is mounted onto a substrate by a flip-chip bonding, FIG. 2($b$) showing a state wherein an underfiller is filled in a gap, and FIG. 2($c$) showing a state wherein the underfiller is cured and then cooled to a normal temperature;

FIGS. (4$a$) and 4($b$) are plan views of the prior art and of a second embodiment of a semiconductor device according to the present invention illustrating the relationship between a substrate and a region, respectively.

FIG. 5($a$) showing a state wherein the semiconductor chip is mounted onto the substrate so that the sides of both are parallel to each other, FIG. 5($b$) showing a state wherein the semiconductor chip is made to rotate so that one of the diagonal lines of the semiconductor chip coincides with one of the diagonal lines of the substrate, and FIG. 5($c$) showing a state wherein the semiconductor chip is made to further rotate to incline the semiconductor chip relative to the substrate so that none of the diagonal lines coincide with each other;

FIG. 6 is an illustration for explaining a concept of corners of a substrate or a semiconductor chip;

FIGS. 9($a$) and 9($b$) are a table and graphs, respectively, showing comparison data of warpage between the semiconductor device of the first embodiment and the prior art semiconductor device.

BEST MODES FOR CARRYING OUT THE INVENTION

The preferred embodiments of a semiconductor device according to the present invention will be described in detail below with reference to the attached drawings.

While an underfiller is used as adhesive interposed between a substrate 10 and a semiconductor chip 12 in the following embodiments, an anisotropic electro-conductive adhesive or anisotropic electro-conductive film may be used as described with reference to the prior art.

(First Embodiment)

Figure 3:
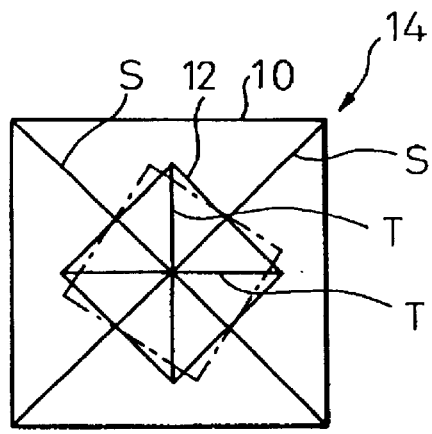
FIG. 3 is a plan view of a first embodiment of a semiconductor device according to the present invention.

A structure of a semiconductor device 14 will be described with reference to FIG. 3.

Contours of a substrate 10 and a semiconductor chip 12 constituting the semiconductor device 14 are of a square shape. The semiconductor chip 12 is mounted onto the substrate 10 by flip-chip bonding so that a center of the semiconductor chip 12 coincides with that of the substrate 10, and fixedly adhered by an underfiller 18.

Figure 1:
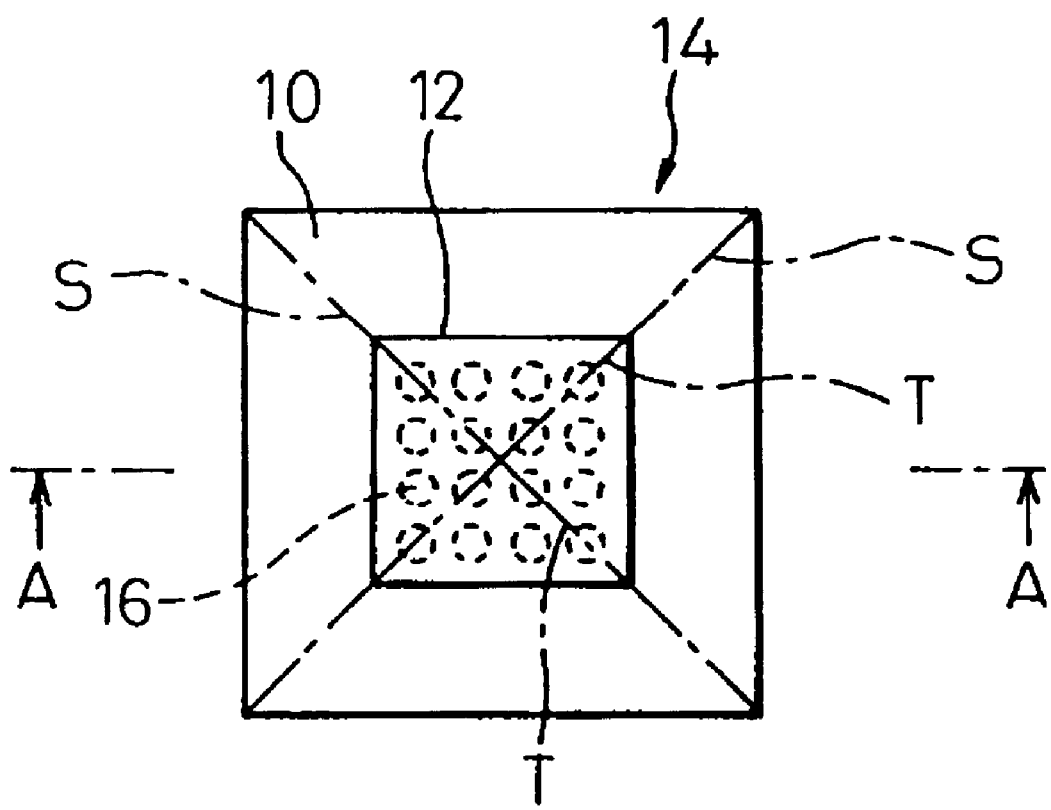
FIG. 1 is a plan view illustrating a contour of one example of a prior art semiconductor device.
Figure 2A:
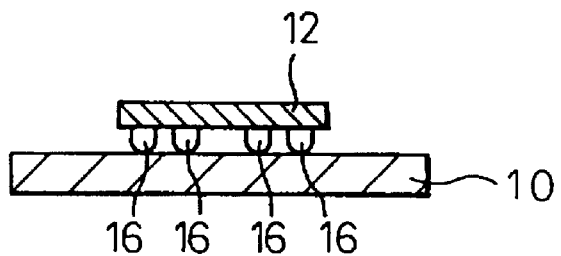
FIGS. 2($a$), 2($b$) and 2($c$) are sectional views taken along a line A—A in FIG. 1, illustrating a sequence of a process for producing the prior art semiconductor device, respectively.
Figure 2B:
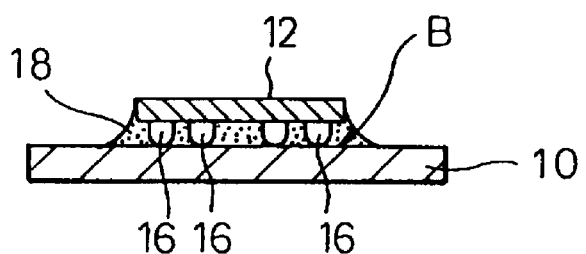
Figure 2C:
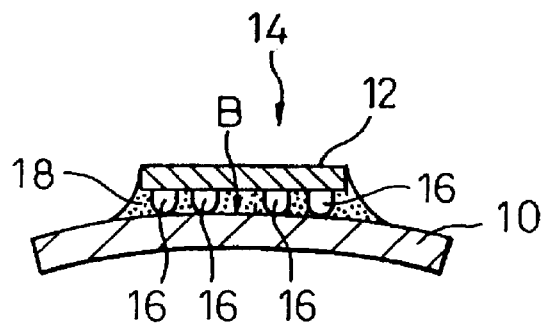

In the prior art semiconductor device 14, as shown in FIG. 1, the respective sides of the substrate 10 and the semiconductor chip 12 are parallel to each other and the respective diagonal lines T of the semiconductor chip 12 coincide with two diagonal lines S of the substrate 10 (i.e., corners of the semiconductor chip 12 are positioned on the diagonal lines S of the substrate 10). On the contrary, according to this embodiment, as shown in FIG. 3, the semiconductor chip 12 is inclined relative to the substrate 10 so that a diagonal line T of the semiconductor chip 12 is deviated from a diagonal line S of the substrate S. As an example, in this embodiment, the inclination angle is 45 degrees. In this state, none of the corners of the semiconductor chip 12 is positioned on the diagonal line S of the substrate 10, and a length of a region B (contact region) of the substrate 10 in contact with the underfiller 1 measured along the diagonal line S8 becomes minimum, because the diagonal line S is parallel or orthogonal to the respective sides of the semiconductor chip 12. Accordingly, the warpage of the substrate 10 along the diagonal line S becomes least. That is, an overall warpage of the semiconductor device 14 also becomes least.

In this regard, the semiconductor chip 12 is inclined at 45 degrees in this embodiment so that the warpage of the substrate 10 along the diagonal line S becomes least. Different inclination angles, however, may be selected as shown in FIG. 3 by a chain line unless the diagonal line T of the semiconductor chip 12 coincides with the diagonal line S of the substrate 10. Even in the latter case, the warpage of the semiconductor device 14 is always less than that in the prior art semiconductor device.

(Second Embodiment)

A structure of this semiconductor device 14 will be described with reference to FIG. 4.

Contours of a substrate 10 and a semiconductor chip 12 constituting the semiconductor device 14 are of a rectangular shape and similar to each other. The semiconductor chip 12 is mounted onto the substrate 10 by a flip-chip bonding so that a center of the semiconductor chip 12 coincides with that of the substrate 10, and is fixedly adhered by an underfiller 18.

Figure 4A:
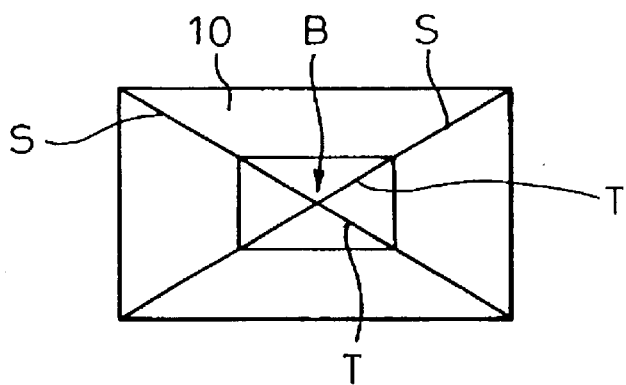
FIG. 4($a$) showing a state wherein the semiconductor chip is mounted onto the substrate so that the sides of the both are parallel to each other, and FIG. (B) showing a state wherein the semiconductor chip is inclined relative to the substrate.
Figure 4B:
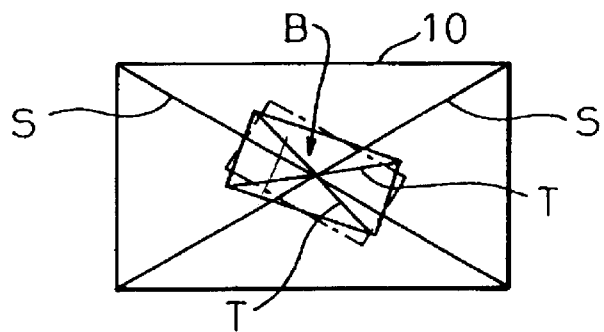

Similar to the first embodiment, the prior art semiconductor device 14 shown in FIG. 4(a) wherein each side of the substrate 10 is parallel to each side of the semiconductor chip 12 is modified so that the respective diagonal lines T of the semiconductor chip 12 do not coincide with the respective diagonal lines S of the substrate 10 by inclining the semiconductor chip 12 relative to the substrate 10 as shown in FIG. 4(b). Thereby, a length of a contact region B of the substrate 10 in contact with the underfiller 18 measured along the diagonal line S, which causes the warpage, becomes shorter in comparison with the prior art semiconductor device 14, and therefore the warpage of the substrate 10 along the diagonal line S becomes least. Accordingly, an overall warpage of the substrate 10 as well as the semiconductor device 14 is also reduced.

In this embodiment, to reduce the warpage of the substrate 10 to a maximum extent, the semiconductor chip 12 is made to incline relative to the substrate 10 so that one of sides of the semiconductor chip 12, particularly a longer side in this case, is parallel to the diagonal line S, as shown in FIG. 4(b) by a chain line. In such a state, a length of the contact region B measured along the diagonal line S of the substrate 10 becomes shortest. Regarding the first embodiment, since the semiconductor chip 12 is of a square shape, there is no distinction between a shorter side and a longer side. Even in this case, supposing that one pair of opposite sides constitute longer sides, it could also be said that a length of the contact region B measured along the diagonal line S of the substrate 10 becomes shortest if the longer side is parallel to the diagonal line S, resulting in the least warpage.

(Third Embodiment)

A structure of this semiconductor device 14 will be described with reference to FIG. 5.

Contours of a substrate 10 and a semiconductor chip 12 constituting the semiconductor device 14 are not similar; i.e., the semiconductor chip 12 is of a square shape and the substrate 10 is of a rectangular shape, for example. The semiconductor chip 12 is mounted onto the substrate 10 by a flip-chip bonding so that a center of the semiconductor chip 12 coincides with that of the substrate 10 and is fixedly adhered by an underfiller 18.

Figure 5A:
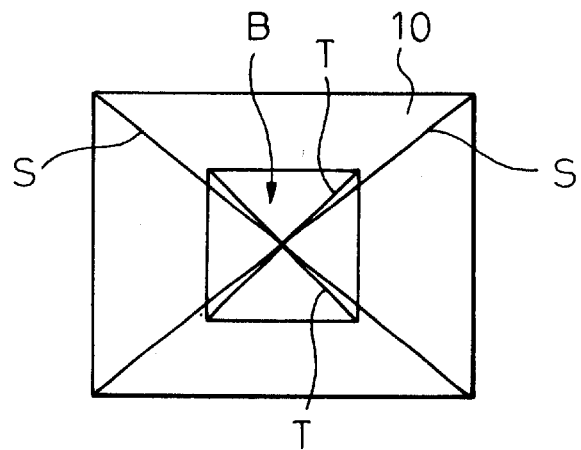
FIGS. 5($a$), 5($b$) and 5($c$) are plan views of the prior art (5($a$)) and of a third embodiment of a semiconductor device according to the present invention (5($b$) and 5($c$)) illustrating the relationship between a substrate and a region, respectively.

According to this embodiment, even in the prior art semiconductor device 14 shown in FIG. 5(a) wherein each side of the substrate 10 is parallel to each side of the semiconductor chip 12, the respective diagonal lines T of the semiconductor chip 12 do not coincide with the respective diagonal lines S of the substrate 10. Therefore, the warpage of the substrate 10 along the diagonal line T becomes less in comparison with a case shown in FIG. 5(b) wherein the semiconductor chip 12 is made to inline relative to the substrate 10 so that one of the diagonal lines T of the semiconductor chip 12 coincides with one of the diagonal lines S of the substrate 10.

Figure 5B:
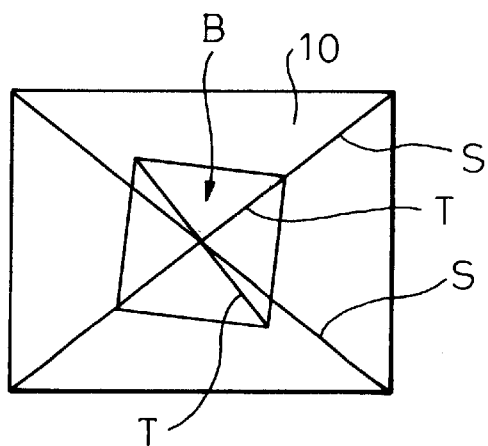
Figure 5C:
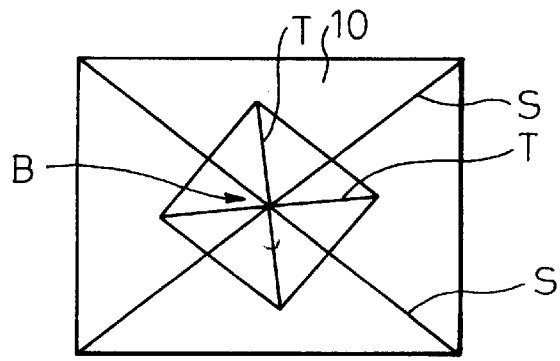

If the semiconductor chip 12 is made to further incline in the same direction from the state shown in FIG. 5(b) so that a pair of longer sides of the semiconductor chip 12 (i.e., one of two pairs of opposite sides since the semiconductor chip 12 is of a square shape in this embodiment) are parallel to one of diagonal lines S of the substrate 10, a length of a region B of the substrate 10 in contact with the underfiller 18 measured along this diagonal line S, which causes the warpage, becomes shortest, resulting in the least warpage generated along the diagonal line S of the substrate 10.

There is a contour of a semiconductor chip 12 or a substrate 10 as shown in FIG. 6 wherein corners thereof are cut off. In such a semiconductor chip 12 or substrate 10, an imaginary corner D is conveniently defined by an intersection between extensions of the respective sides, and a diagonal line is defined by a straight line connecting these imaginary corners D with each other.

Although not specifically described, when the semiconductor chip 12 is inclined relative to the substrate 10, positions of a group of connector pads formed on the substrate 10 must, of course, be inclined as a whole in correspondence thereto.

Figure 7A:
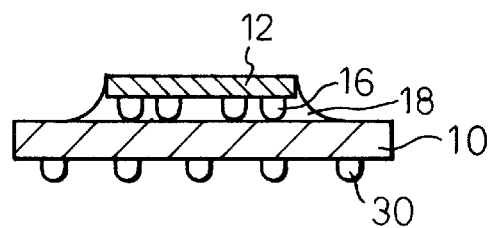
FIGS. 7($a$) to 7($d$) are sectional views, respectively, illustrating various types of a complete semiconductor device according to the present invention.
Figure 7B:
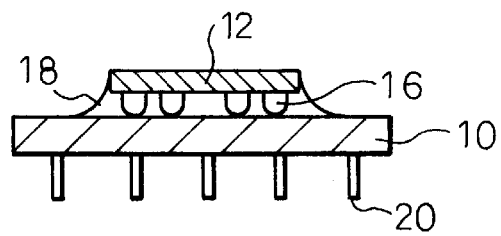
Figure 7C:
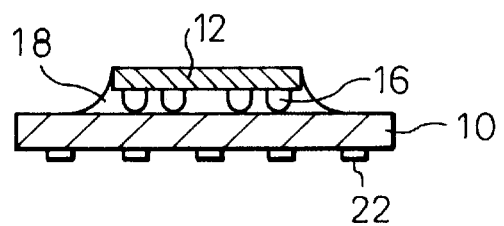
Figure 7D:
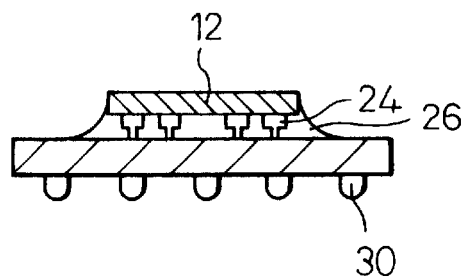

FIGS. 7(a) to 7(d) illustrate various types of a completed semiconductor device according to the present invention, particularly classified in accordance with kinds of substrates. FIG. 7(a) is a semiconductor device of a ball grid array type wherein solder bumps 30 are used also in the substrate 10 as external connector terminals. FIG. 7(b) is a semiconductor device of a pin grid array type wherein pins 20 are used in the substrate 10 as external connector terminals. FIG. 7(c) is a semiconductor device of a land grid array type wherein lands 22 are used as external connector terminals. FIG. 7(d) is a semiconductor device of a ball grid array type wherein Au stud bumps are used as electrodes 24 of the semiconductor chip 12, and an anisotropic electro-conductive film 26 is used as adhesive means.

Figure 8:
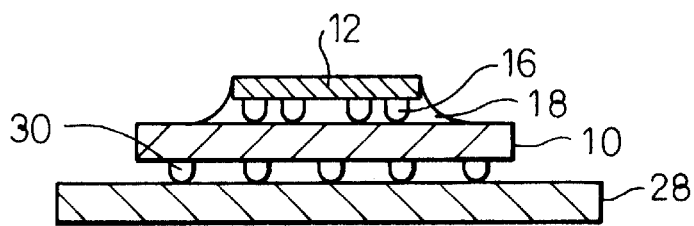
FIG. 8 is a sectional view of a semiconductor device according to the present invention mounted to a mother board.

FIG. 8 illustrates a semiconductor device according to the present invention mounted onto a mother board 28. While this semiconductor device is of a ball grid array type shown in FIG. 7(a), other types may be mounted onto the mother board 28 in the same manner. In this case, since the warpage of the substrate 10 is reduced as described above, a stress in the connection between the solder bumps 30 of the substrate 10 and the mother board 28 becomes smaller.

Next, as shown in FIGS. 9(a) and 9(b), five samples of the prior art semiconductor device (Nos. 3, 2, 8, 6 and 4) and five samples of the semiconductor device according to the first embodiment (Nos. 5, 9, 1, 7 and 10) were prepared for the purpose of comparison. They were tested to determine the warpage in an initial state wherein the semiconductor chip 12 is merely mounted onto the substrate 10 and the warpage in a final state after the underfiller 18 has been filled and cured, from which is obtained the respective difference in warpage (DELTA) from the initial state to the final state. A size of the semiconductor chip 12 was 15 mm×15 mm, and that of the substrate 10 was 40 mm×40 mm. The warpage was measured by a non-contact type tester (RVSI; LS-3900DB).

Upon the selection of the respective samples, care was taken so that the samples of the prior art semiconductor device (shown in FIG. 1) and those of the semiconductor device according to the present invention (shown in FIG. 3) respectively include one having, in the initial state, the same tendency in the direction and amount of the warpage.

As apparent from the test results, the semiconductor device according to the present invention is always less in DELTA than the prior art semiconductor device between the respective pair of samples of the same tendency (5 and 3; 9 and 2; 1 and 8; 7 and 6; and 10 and 4), which exhibits the favorable effect of the present invention. In a table of FIG. 9(a), curves in a column of DIRECTION, Initial State and Final State illustrate profiles of warpage, as seen in the lateral direction, in the initial and final states of the semiconductor device carrying the semiconductor chip on the upper side.

While the present invention was described above with reference to the preferred embodiments, it should be noted that the present invention is not limited to the above-mentioned embodiments but includes various changes and modifications without departing from a spirit of the invention.

CAPABILITY OF EXPLOITATION IN INDUSTRY

According to the semiconductor device of the present invention, a length of the contact region of the substrate in contact with the adhesive measured along a diagonal line of the substrate, which is likely to cause the maximum warpage, becomes always shorter in comparison with the prior art semiconductor device wherein diagonal lines of the substrate and the semiconductor chip coincide with each other. Accordingly, it is possible to reduce the warpage at opposite ends of the diagonal line of the substrate; i.e., the corners thereof; resulting in the reduction in an overall warpage of the semiconductor device.

In addition, the warpage becomes even less if the semiconductor chip is mounted onto the substrate so that one of sides thereof is parallel to one of diagonal lines of the substrate, because a length of the region of the substrate for mounting the semiconductor chip measured along the diagonal line of the substrate becomes a minimum.

The present invention is in particular suitably applicable to a semiconductor device of a ball grid array type and a land grip array type which is particularly required to have a flatness when mounted to a mother board 28, because if the substrate 10 is warped, there are solder bumps or lands incapable of being connected to the mother board 28.

What is claimed is:

1. A semiconductor device comprising:

a substrate made of an electro-insulating material and having first and second surfaces, the substrate having connector terminals formed on the first surface thereof and external connecting terminals formed on the second surface thereof, wherein a plan view contour of the substrate is selected from the group consisting essentially of a substantially square shape and a substantially rectangular shape, having in a plan view two pairs of parallel sides and two diagonal lines;

a semiconductor chip having electrodes, wherein the semiconductor chip is mounted on the first surface of the substrate, so that the electrodes of the semiconductor chip are flip-chip bonded with the connector terminals of the substrate, wherein a plan view contour of the semiconductor chip is selected from the group consisting essentially of a substantially square shape and a substantially rectangular shape, having in a plan view two pairs of parallel sides and two diagonal lines;

the semiconductor chip being arranged with respect to the substrate in such a manner that a center of the semiconductor chip coincides with a center of the substrate in plan view, wherein in plan view each diagonal line of the semiconductor chip is not parallel to a diagonal line of the substrate and each side of the semiconductor chip is not parallel to a side of the substrate; and a cured adhesive that fills a gap between the substrate and the semiconductor chip, wherein warpage of the substrate is less than warpage in a semiconductor device that has each side of the semiconductor chip parallel to a side of the substrate.

2. A semiconductor device as defined by claim 1, characterized in that either one of the sides of the semiconductor chip is parallel to either one of the diagonal lines of the substrate.

3. A semiconductor device as defined by claim 1, characterized in that the cured adhesive is an underfiller comprised of an epoxy type resin.

4. A semiconductor device as defined by claim 1, characterized in that the cured adhesive is an anisotropic electro-conductive adhesive.

5. A semiconductor device as defined by claim 1, characterized in that the cured adhesive is an anisotropic electro-conductive film having adhesivity.

6. The semiconductor device of claim 1, wherein the adhesive is a thermosetting resin.

7. A semiconductor device comprising:

a substrate made of an electro-insulating material and having first and second surfaces, the substrate having connector terminals on the first surface thereof and external connecting terminals formed on the second surface thereof, wherein in plan view the first surface of the substrate is bounded by a first side, a second side, a third side, and a fourth side, these sides substantially forming a square shape or rectangular shape, wherein the first side and the third side are substantially parallel, wherein the second side and the fourth side are substantially parallel, and having first and second diagonal lines, wherein the first diagonal line extends from the intersection of the first and second sides to the intersection of the third and fourth sides, and the second diagonal line extends from the intersection of the first and fourth sides to the intersection of the second and third sides;

a semiconductor chip having first and second surfaces and electrodes, with at least a portion of the semiconductor chip electrodes being on the second surface thereof, wherein in plan view the second surface of the semiconductor chip is bounded by a first side, a second side, a third side, and a fourth side, these sides substantially forming a square shape or rectangular shape, wherein the first side and the third side are substantially parallel, wherein the second side and the fourth side are substantially parallel, and having first and second diagonal lines, wherein the first diagonal line extends from the intersection of the first and second sides to the intersection of the third and fourth sides, and the second diagonal line extends from the intersection of the first and fourth sides to the intersection of the second and third sides;

wherein the semiconductor chip is mounted on the first surface of the substrate, so that the electrodes of the semiconductor chip are flip-chip bonded with the connector terminals of the substrate;

wherein a cured adhesive is in at least part of the gap between the first surface of the substrate and the second surface of the semiconductor chip, characterized in that in plan view the first and second sides of the semiconductor chip are each not parallel to the first and second sides of the substrate, and the first and second diagonal lines of the semiconductor chip are each not parallel to the first and second diagonal lines of the substrate, wherein warpage of the substrate is less than warpage in a semiconductor device that has each side of the semiconductor chip parallel to a side of the substrate.

8. The semiconductor device of claim 7 wherein in plan view the semiconductor chip has a center defined by the intersection of the first and second semiconductor chip diagonal lines, wherein the substrate has a center defined by the intersection of the first and second substrate diagonal lines, and wherein in plan view the center of the semiconductor chip coincides with the center of the substrate.

9. The semiconductor device of claim 1, wherein the adhesive is a thermosetting resin.

* * * * *

UNITED STATES PATENT AND TRADEMARK OFFICE
CERTIFICATE OF CORRECTION

PATENT NO.    : 6,303,998 B1
DATED         : October 16, 2001
INVENTOR(S)   : Kei Murayama It is certified that error appears in the above-identified patent and that said Letters Patent is hereby corrected as shown below:

Title page,
After "[21] Application No.: 09/376,606," please insert the following line:
-- Item    [22] PCT Filed: December 24, 1998
           [86] PCT No.: PCT/JP98/05888

[87] PCT Pub. No: WO/99/34436
               PCT Pub. Date: July 8, 1999

Column 1,
Line 4, insert:

-- This application is a continuation of the national stage entry of International Application PCT/JP98/05888, filed December 24, 1998. --

Signed and Sealed this

Twenty-fifth Day of June, 2002

*Attest:*

JAMES E. ROGAN
*Attesting Officer*      *Director of the United States Patent and Trademark Office*